United States Patent
Asghari et al.

(10) Patent No.: US 9,379,515 B1
(45) Date of Patent: Jun. 28, 2016

(54) LASER COMBINING LIGHT SIGNALS FROM MULTIPLE LASER CAVITIES

(75) Inventors: Mehdi Asghari, Pasadena, CA (US); Dazeng Feng, El Monte, CA (US)

(73) Assignee: Mellanox Technologies Silicon Photonics Inc., Monterey Park, CA (US)

( * ) Notice: Subject to any disclaimer, the term of this patent is extended or adjusted under 35 U.S.C. 154(b) by 482 days.

(21) Appl. No.: 13/385,275

(22) Filed: Feb. 9, 2012

Related U.S. Application Data

(60) Provisional application No. 61/463,054, filed on Feb. 10, 2011.

(51) Int. Cl.
  *H01S 5/00* (2006.01)
  *H01S 3/13* (2006.01)
  *H01S 3/10* (2006.01)
  *H01S 5/068* (2006.01)
  *H01S 5/0625* (2006.01)

(52) U.S. Cl.
  CPC .......... *H01S 3/1307* (2013.01); *H01S 3/10053* (2013.01); *H01S 5/06821* (2013.01); *H01S 5/0625* (2013.01)

(58) Field of Classification Search
  CPC . H01S 3/10053; H01S 3/1307; H01S 5/0625; H01S 5/06821; H01S 5/4025–5/4093
  USPC .................. 372/50.1, 50.12, 50.121, 50.122, 372/50.123, 50.22
  See application file for complete search history.

(56) References Cited

U.S. PATENT DOCUMENTS

| | | | | |
|---|---|---|---|---|
| 4,692,925 | A | * | 9/1987 | Botez ....................... 372/50.123 |
| 4,822,151 | A | * | 4/1989 | Tatsuno et al. ........... 359/489.07 |
| 6,101,210 | A | | 8/2000 | Bestwick et al. |
| 6,842,472 | B1 | * | 1/2005 | Shimonaka ................. 372/50.1 |
| 2005/0053322 | A1 | * | 3/2005 | Jenkins et al. ................. 385/22 |
| 2005/0243874 | A1 | * | 11/2005 | Paoletti et al. .................. 372/20 |

OTHER PUBLICATIONS

Bestwick, Tim, "ASOC—A Silicon-Based Integrated Optical Manufacturing Technology," 1998 Electronic Components and Technology Conference, IEEE, pp. 566-571 (1998).

* cited by examiner

*Primary Examiner* — Joshua King
(74) *Attorney, Agent, or Firm* — Gavrilovich, Dodd & Lindsey, LLP

(57) ABSTRACT

An optical chip includes multiple laser cavities that each reflects a different portion of a light signal back and forth between reflective components. Each laser cavity guides one of the light signal portions through one or more waveguides. The one or more waveguides from different laser cavities being optically coupled to one another. A combiner receives the light signal portion from each of the laser cavities and combines the light signal portions into a light signal.

20 Claims, 9 Drawing Sheets

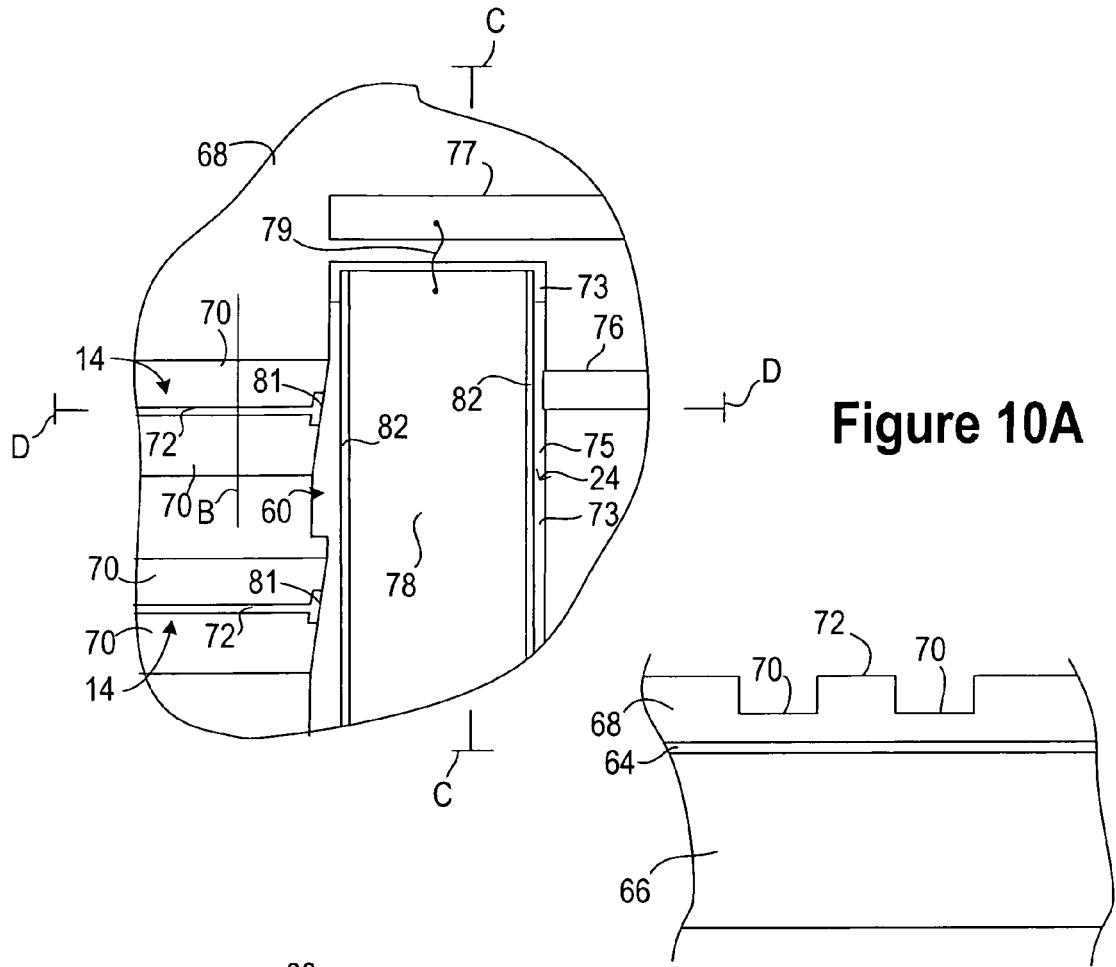
Figure 10A
Figure 10B
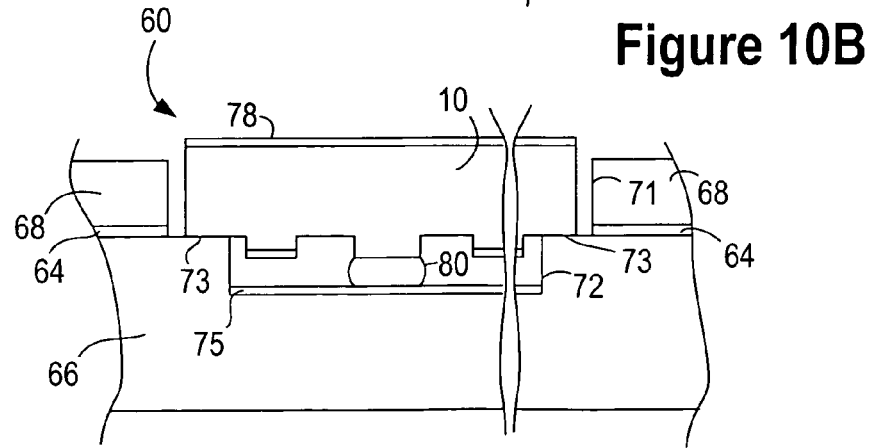
Figure 10C

LASER COMBINING LIGHT SIGNALS FROM MULTIPLE LASER CAVITIES

RELATED APPLICATIONS

This Application claims the benefit of U.S. Provisional Patent Application Ser. No. 61/463,054, filed on Feb. 10, 2011, entitled "Laser Combining Light Signals from Multiple Laser Cavities," and incorporated herein in its entirety.

FIELD

The present invention relates to optical devices and more particularly to an optical chip for generating a laser.

BACKGROUND

Optical communication systems often employ lasers as the source of the light signals that are processed by the system. These lasers are generally solid state lasers where the gain medium is defined by one or more solid layers of a chip. Increasing the intensity of these lasers can improve the performance of these systems. As a result, there is a need to increase the intensity of solid state chip lasers.

SUMMARY

An optical chip includes multiple laser cavities that each reflects a different portion of a light signal back and forth between reflective components. Each laser cavity guides one of the light signal portions through one or more waveguides. The one or more waveguides from different laser cavities are optically coupled to one another. A combiner receives the light signal portion from each of the laser cavities and combines the light signal portions into a light signal.

BRIEF DESCRIPTION OF THE FIGURES

FIG. 10A through FIG. 10D illustrate a portion of a device having an interface between a cavity waveguide and a gain medium chip that includes the gain medium. FIG. 10A is a topview of the device.

FIG. 10B is a cross section of the device shown in FIG. 10A taken along the line labeled B. The line labeled B extends through the cavity waveguide disclosed in FIG. 10A.

FIG. 10C is a cross section of the device shown in FIG. 10A taken along a line extending between the brackets labeled C in FIG. 10A.

FIG. 10D is a cross section of the device shown in FIG. 10A taken along a line extending between the brackets labeled D in FIG. 10A.

DESCRIPTION

An optical chip includes multiple laser cavities. Each of the laser cavities guides a portion of a light signal though one or more waveguides. The waveguides from the different laser cavities are all positioned on a common base. The waveguides are arranged on the base so that the waveguides from different laser cavities are optically coupled to one another even though they are present in different laser cavities. The optical coupling of these waveguide causes the different light signal portions to be in phase with each other. A combiner receives the light signal portions and combines them into an output light signal. Since the different portions of the light signal are in phase with one another when they are combined, the different portions of the light signal are constructively combined. As a result, the intensity of the output light signal is increased relative to prior laser chips.

Figure 1:
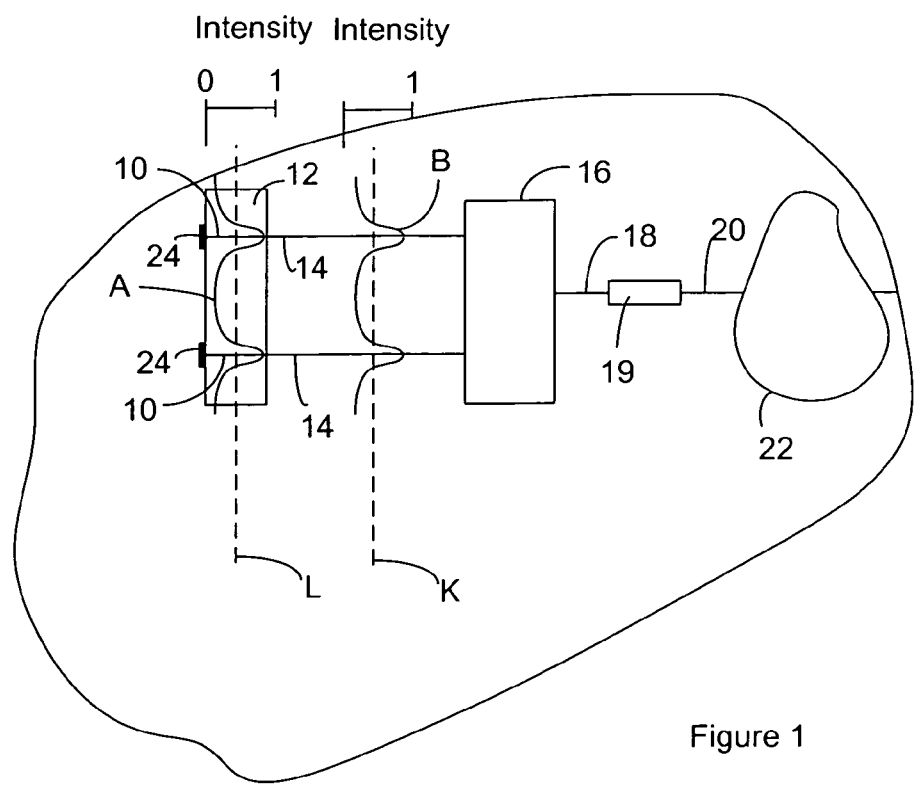
FIG. 1 through FIG. 6 are each a schematic diagram of an optical device that includes multiple laser cavities that each guides a light signal through one or more waveguides. The one or more waveguides of different laser cavities are optically coupled to one another. A light signal combiner is common to each of the laser cavities.

FIG. 1 is a schematic of an optical device that includes a laser constructed according to the present invention. The device includes gain waveguides 10 defined in a gain medium 12. Cavity waveguides 14 provide an optical pathway from the gain waveguides 10 to a combiner 16. A common waveguide 18 provides an optical pathway from the combiner 16 to a partial return device 19 that serves as a common reflective device. An output waveguide 20 provides an optical pathway from the partial return device 19 to optical components 22 included on the device. The optical components 22 are optional and in some instances, the output waveguide 20 terminates at a facet located centrally on the device or at an edge of the device so the device can be connected to an optical fiber. Examples of suitable optical components 22 include, but are not limited to, demultiplexers, multiplexers, filters, switches, amplifiers, star couplers, optical fibers, circulators, optical attenuators, etc.

During operation of the device, the combiner 16 receives a portion of a light signal (light signal portions) from each of the cavity waveguides 14. The combiner 16 combines the light signal portions into a light signal. The common waveguide 18 carries the light signal from the combiner 16 to the partial return device 19. The partial return device 19 returns a first portion of the light signal along its original path and permits an output portion of the light signal to enter the output waveguide 20. As a result, the output portion of the light signal serves as the laser output.

The common waveguide 18 carries the first portion of the light signal back to the combiner 16. The combiner 16 acts as a splitter that splits the first portion of the light signal into the light signal portions and places a different light signal portion on each of the cavity waveguides 14. The combiner 16 is preferably configured to act as a wavelength independent splitter where the different light signal portions do not have wavelength dependence. A wavelength independent splitter does not have demultiplexing functionality. For instance, the combiner 16 is preferably configured to split the light signal into light signal portions that each have the same distribution of wavelengths. More specifically, the combiner 16 preferably splits the light signal into light signal portions where the percentage of the light signal portion that has a particular wavelength is about the same for each of the light signal portions.

The light signal portions generated by the splitter each travels along one of the cavity waveguides 14 to one of the gain waveguides 10. The gain waveguides 10 each guides the received light signal portion through a gain medium 12 which is the source of optical gain in the laser. One or more reflectors 24 each receives a light signal portion guided by one of the gain waveguides 10. The one or more reflectors 24 reflect each of the light signal portions such that the light signal portions return to the associated gain waveguide 10 and eventually to the combiner 16. Accordingly, each of the light signal portions travels through a gain waveguide 10 twice before returning to the combiner 16. The one or more reflectors 24 can each be highly reflective so substantially all of each light signal portions is returned to one of the gain waveguides 10.

Although FIG. 1 shows the one or more reflectors 24 as a plurality of reflectors, the one or more reflectors 24 can be combined into one reflector configured to reflect each of the received light signal portions back into one of the gain waveguides 10.

The gain waveguides 10 are optically coupled to one another. The optical coupling of the waveguides allows the light signal portions in different gain waveguides 10 to effectively act as one mode. As a result, the light signal portions in different gain waveguides 10 are in phase. Optical coupling is achieved by constructing the gain waveguides 10 such that light guided in one of the gain waveguides 10 can travel through the device and enter each of the neighboring gain waveguides 10 and/or interact with a light signal portion in each of the neighboring gain waveguides 10. Optical coupling decreases and can be eliminated as the separation between the gain waveguides 10 increases. Accordingly, the proximity of the gain waveguides 10 to one another is selected so the optical coupling results. For instance, the displacement between adjacent gain waveguides 10 can be such that the intensity of light between gain waveguides 10 during operation of the device is non-zero at each location between adjacent gain waveguide 10. The line labeled A in FIG. 1 illustrates this. For instance, the line labeled A shows the intensity of the light signal portions within the device at the location of the line labeled L. Since the gain waveguides 10 are optically coupled, the light signal portions in different gain waveguide 10 interact and the intensity of the light signal portions does not drop to zero between the gain waveguides 10.

Additionally, the cavity waveguides 14 are optically coupled to one another. As with the gain waveguides 10, the optical coupling of the cavity waveguides 14 allows the light signal portions in different cavity waveguides 14 to effectively act as one mode. As a result, the light signal portions in different cavity waveguides 14 are in phase. Optical coupling is achieved by constructing the cavity waveguides 14 such that light guided in one of the cavity waveguides 14 can travel through the device and enter each of the neighboring cavity waveguides 14 and/or interact with a light signal portion in each of the neighboring cavity waveguides 14. Optical coupling decreases and can be eliminated as the separation between the cavity waveguides 14 increases. Accordingly, the proximity of the cavity waveguides 14 to one another is selected so the optical coupling results. For instance, the displacement between adjacent cavity waveguides 14 can be such that the intensity of light between cavity waveguides 14 during operation of the device is non-zero at each location between adjacent cavity waveguide 14. The line labeled B in FIG. 1 illustrates this. For instance, the line labeled B shows the intensity of the light signal portions within the device at the location of the line labeled K. Since the cavity waveguides 14 are optically coupled, the light signal portions in different cavity waveguide 14 interact and the intensity of the light signal portions does not drop to zero between the cavity waveguides 14.

The gain waveguides 10, the cavity waveguides 14, and the combiner 16 are constructed such that the distance that each of the light signal portions travels between the one or more reflectors 24 and the location where the light signal portions are combined is the same. Since this distance is the same and the light signal portions are in phase in the gain waveguides 10 and in the cavity waveguides 14, the light signal portions are in phase when they are combined by the combiner 16. As a result, the light signal portions are constructively combined.

The result of the above construction and operation is that each of the light signal portions resonate between the one or more reflectors 24 and the partial return device 19. As a result, the one or more reflectors 24 and the partial return device 19 define the ends of multiple laser cavities within the device. The distribution of wavelengths resonating in each of the laser cavities is determined by the gain medium 12 and the partial return device 19. Since the partial return device 19 is common to each of the laser cavities and the gain medium 12 used in each of the laser cavities is the same, in some instances, the combiner 16 combines multiple light signal portions that each have the same wavelength distribution and are in phase. As a result, the intensity of the light signal output on the common waveguide the can be the intensity of constructively adding the light signal portions in each of the laser cavities. Additionally, the gain medium 12 and partial return device 19 are selected so the resulting light signal has a selection of wavelengths associated with a single optical channel such as one of the channels used in communications applications. For instance, the light signal can have a single grouping of wavelengths around the wavelength of the channel.

Figure 2:
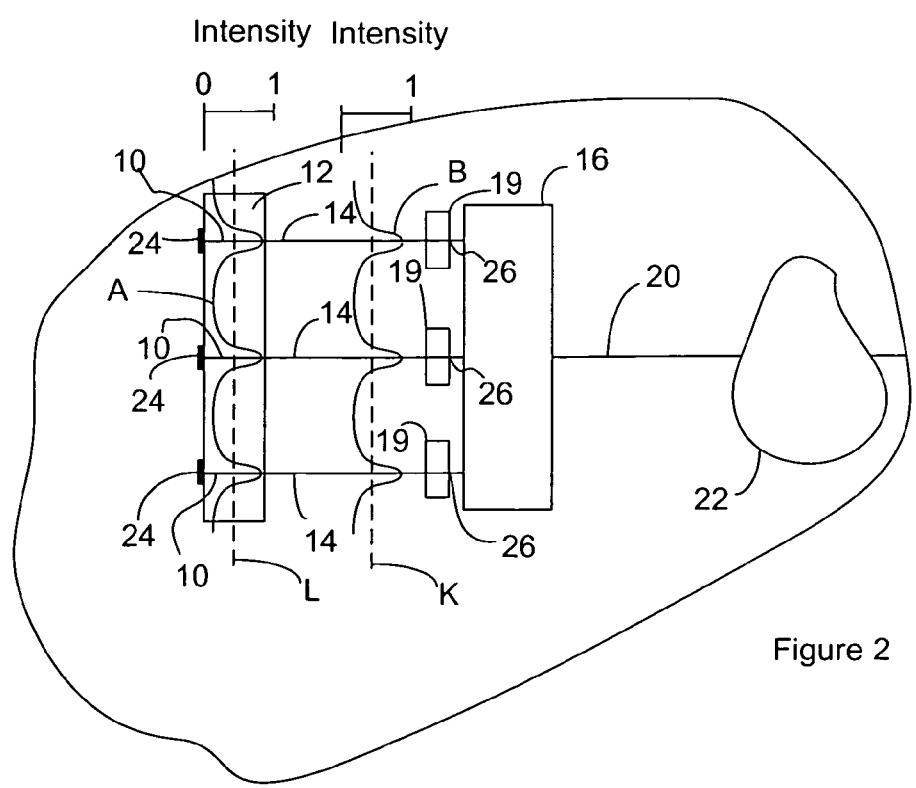

FIG. 1 illustrates the combiner 16 positioned within the laser cavities, however, the combiner 16 can be positioned after the laser cavities. For instance, FIG. 2 shows a device such as is shown in FIG. 1 with the combiner 16 positioned after each of the laser cavities. More particularly, partial return devices 19 are each located along a different optical path between the one or more reflectors 24 and the combiner 16. The cavity waveguides 14 and the gain waveguides 10 are optically coupled as described above.

In the embodiment of FIG. 2, transition waveguides 26 each provide an optical pathway away from one of the partial return devices 19 to the combiner 16. Accordingly, the transition waveguides 26 each provides an optical pathway away from one of the laser cavities to the combiner 16. Positioning the combiner 16 after the laser cavities is useful when more than two light signal portions are being combined or an odd number of light signal portions are being combined as it can simplify the laser design. Accordingly, FIG. 2 is illustrated as combining three light signal portions although as few as two and more than three are possible.

During operation of the device, the light signal portions each travels along one of the cavity waveguides 14 to one of the gain waveguides 10. The gain waveguides 10 each guides the received light signal portion through a gain medium 12 which is the source of optical gain in the laser. One or more reflectors 24 each receives a light signal portions guided by one of the gain waveguides 10. The one or more reflectors 24 can each be highly reflective so substantially all of each of the light signal portions is returned to one of the gain waveguides 10. The reflected light signal portions each return to the associated gain waveguide 10 and then to the associated cavity waveguide 14. Accordingly, each of the light signal portions travels through a gain waveguide 10 twice before returning to the cavity waveguide 14.

The cavity waveguides 14 each guide one of the light signal portions to one of the partial return devices 19. Each partial return device 19 returns a portion of the received light signal portion along its original path. As a result, each partial return device 19 returns a portion of the received light signal portion to the cavity waveguide 14 but traveling toward the gain waveguide 10. The different partial return devices 19 are configured such that each partial return device 19 returns the same distribution of wavelengths to the cavity waveguide 14. For instance, the partial return devices 19 can each be a Bragg grating configured to reflect the same wavelength back into the cavity waveguide 14. The returned portion of the light signal portion lases as a result of traveling back and forth between one of the one or more reflectors 24 and one of the partial return devices 19.

The partial return devices 19 also allow an output portion of the received light signal portion to enter the associated transition waveguide 26. The transition waveguides 26 carry the light signal waveguide to the combiner 16 which combines the received light signal portions into a light signal that is received at the output waveguide. Accordingly, the light signal received at the output waveguide 20 serves as the laser output. The output waveguide carries the light signal to the optical components 22. The optical components 22 are optional and in some instances, the output waveguide 20 terminates at a facet located centrally on the device or at an edge of the device so the device can be connected to an optical fiber.

Although FIG. 2 shows the one or more reflectors 24 as a plurality of small reflectors, the one or more reflectors 24 can be combined into one reflector extending along the backside of the gain medium 12.

The gain waveguides 10 and the cavity waveguides 14 are optically coupled to one another as described in the context of FIG. 1. As noted above, the optical coupling of these waveguides allows the light signal portions in different gain waveguides 10 to effectively act as one mode. As a result, the light signal portions in different gain waveguides 10 and cavity waveguides 14 are in phase.

Additionally, the transition waveguides 26 each carry one of the light signal portions to the combiner 16. The transition waveguides 26 and the combiner 16 are constructed such that the length of the optical path from each laser cavity to the place where they are combined is the same or is different by $n\lambda$ where $\lambda$ is the wavelength of the light signal and n is an integer. These length selections keep the light signal portions in phase when they are combined to form the light signal.

The result of the above construction and operation is that each of the light signal portions resonates between one of the one or more reflectors 24 and one of the partial return devices 19. Accordingly, the one or more reflectors 24 and the partial return device 19 define the ends of multiple laser cavities within the device. The distribution of wavelengths resonating in each of the laser cavities is determined by the gain medium 12 and the partial return device 19. Since the partial return devices 19 each return the same distribution of wavelengths and the gain medium 12 used in each of the laser cavities is the same, in some instances, the combiner 16 combines multiple light signal portions that each have the same wavelength distribution and are in phase. As a result, the intensity of the light signal output by the can be the intensity of constructively adding the light signal portions in each of the laser cavities. Additionally, the gain medium 12 and partial return device 19 are selected so the resulting light signal has a selection of wavelengths associated with a single optical channel such as one of the channels used in communications applications. For instance, the light signal can have a single grouping of wavelengths around the wavelength of the channel.

As is evident from the above description of FIG. 2, the combiner 16 does not act as a splitter during the operation of the device. As a result, in some instances, the combiner 16 is not a wavelength independent combiner 16. Accordingly, an optical multiplexer can serve as the combiner 16. In some instances, the combiner 16 is a wavelength independent combiner 16.

Figure 3:
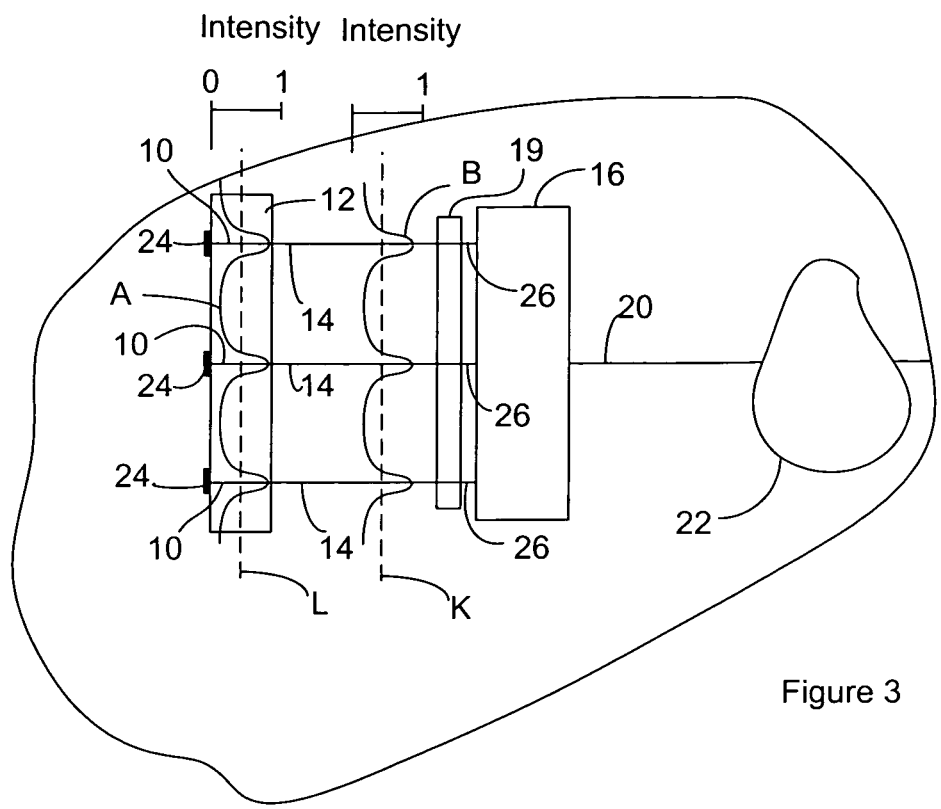

Although FIG. 2 shows a different partial return device 19 included in each of the laser cavities, the partial return device 19 can be common to each of the laser cavities. For instance, FIG. 3 illustrates the device of FIG. 2 with a single partial return device 19 positioned along each of the cavity waveguides 14.

Figure 4:
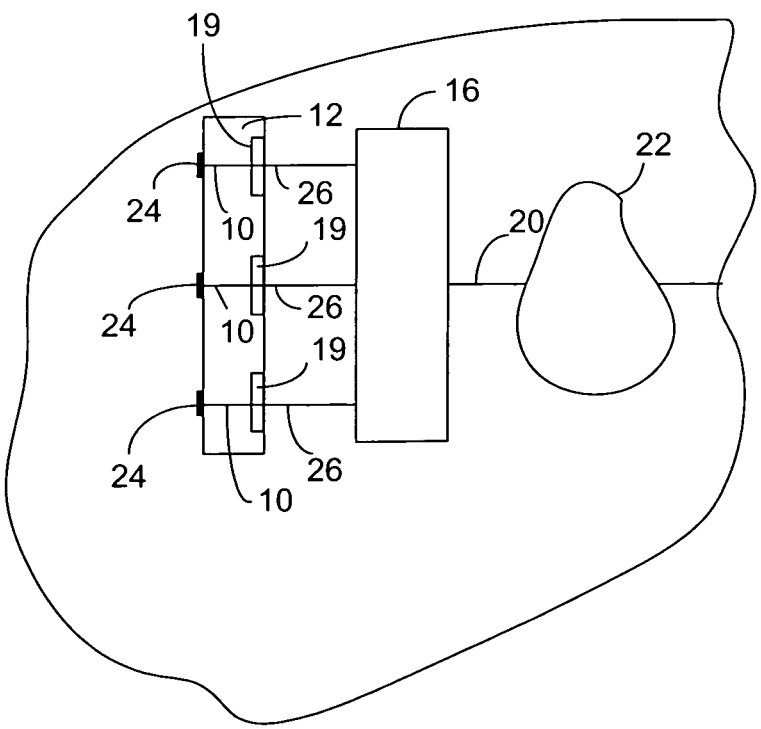

FIG. 2 illustrates the partial return devices 19 positioned along each of the cavity waveguides 14; however, the partial return devices 19 can be located in the gain medium 12. For instance, FIG. 4 shows the device of FIG. 2 with the partial return devices 19 positioned in the gain medium 12. More particularly, each of the partial return devices 19 is located along one of the gain waveguides 10. This effectively eliminates the cavity waveguides 14 from the device of FIG. 2. As with the device of FIG. 2, the gain waveuides of FIG. 4 are optically coupled.

In FIG. 4, the partial return devices 19 are located at an edge of the gain medium 12. As a result, the transition waveguides 26 extend from the gain medium 12 to the combiner 16. In some instances, the partial return devices 19 can be centrally located in the gain medium 12. In these instances, the transition waveguides 26 each extends from one of the partial return devices 19 to the combiner 16. As a result, the portion of each transition waveguide 26 can travel through the gain medium 12. As noted above, the transition waveguides 26 and the combiner 16 are constructed such that the length of the optical path from each laser cavity to the place where they are combined is the same or is different by $n\lambda$ where $\lambda$ is the wavelength of the light signal and n is an integer. These length selections keep the light signal portions in phase when they are combined to form the light signal.

Although FIG. 4 shows multiple partial returns devices, the device can include one partial return device 19 that is located in the gain medium 12 and is common to each of the gain waveguides 10.

In each of the above embodiments, the gain waveguides 10 are defined in a single gain medium 12. The gain medium 12 of FIG. 1 through FIG. 4 can have a substantially uniform construction and chemical composition. As a result, the selection of wavelengths produced within each of the different laser cavities can be substantially the same. The intensity of the wavelengths in different laser cavities can be changed by altering the characteristics of the combiner. In some instances, the combiner is constructed such that the wavelength distribution, as characterized by an intensity versus wavelength graph, is the same or substantially the same for each of the different laser cavities. The similarity of the wavelength distribution within each of the gain waveguides 10 allows the different light signal portions to be kept in phase during operation of the device.

Figure 5A:
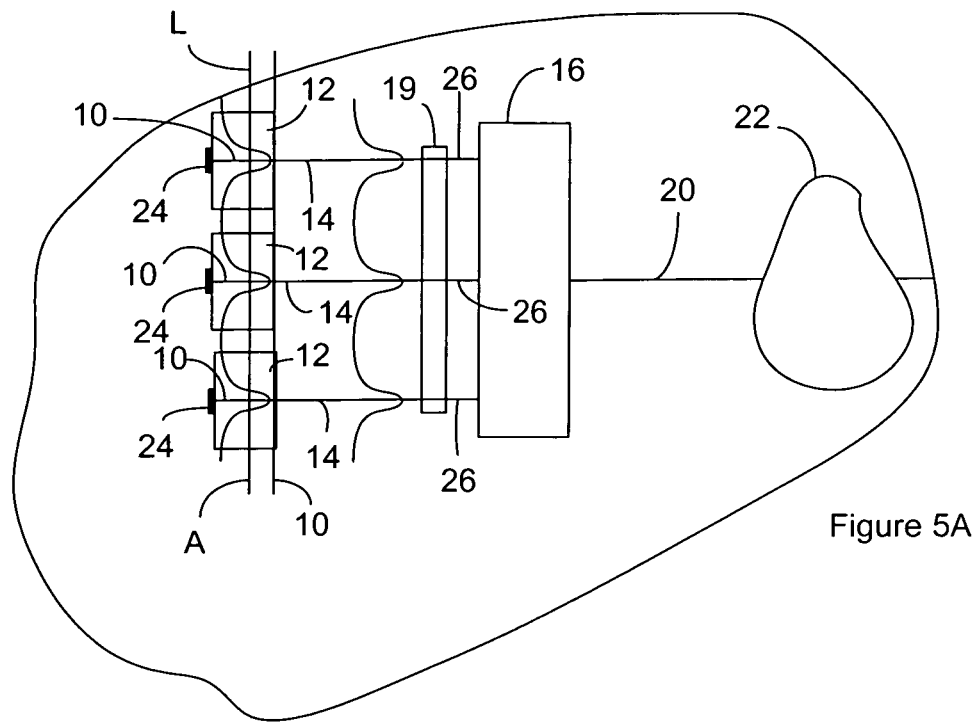

The device can include multiple gain media and one or more of the gain waveguides 10 can be defined in each of the gain media. For instance, FIG. 5A shows the device of FIG. 2 but with each of the gain waveguides 10 defined in a different gain medium 12. The optical coupling between the gain waveguides 10 can be through a light-transmitting medium that is located between adjacent gain waveguides 10 and is not a laser gain medium 12. For instance, the optical device can be constructed on a silicon-on-insulator wafer. In these instances, the optical coupling between adjacent gain waveguides 10 can be achieved as a result of the light signal portions in adjacent gain waveguides 10 interacting through silicon on the silicon-on-insulator wafer.

When the device includes multiple gain media, each of the gain media can be a different material but are preferably the same. When each of the gain media is the same, each gain medium 12 can have about the same construction (shape, size) and chemical composition (same layers of material). When the gain media are each the same, the distribution of wavelengths produced within each gain medium 12 is substantially the same. The similarity of the wavelength distribution within each of the gain waveguides 10 allows the different light signal portions to be kept in phase during operation of the device.

Additionally, as shown in FIG. 5A, when the device includes multiple gain media, the gain media can be arranged so a line through corresponding parts of the different gain media (labeled A in FIG. 5A) is parallel to a second line that is perpendicular to the direction of propagation of a light signal portion through the gain medium 12 at the facet of the gain medium 12 (labeled B in FIG. 5A). This arrangement preserves the same phase nature of the light signal portions.

Figure 5B:
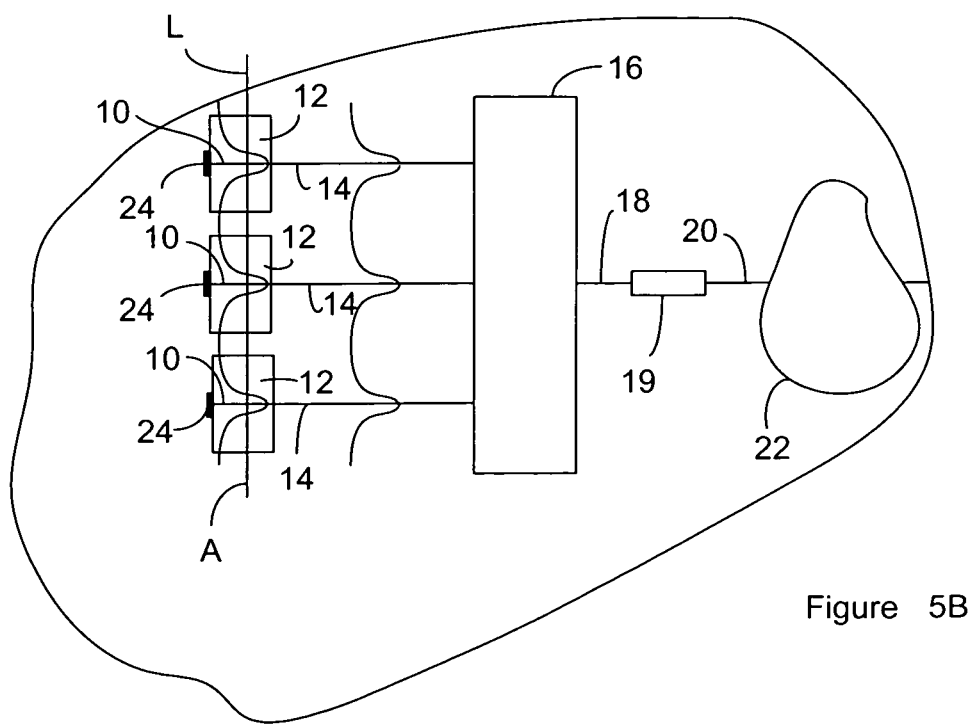

Although FIG. 5A shows the combiner 16 positioned after the laser cavities, the combiner 16 can be positioned within the laser cavities as shown in FIG. 5B.

Figure 6:
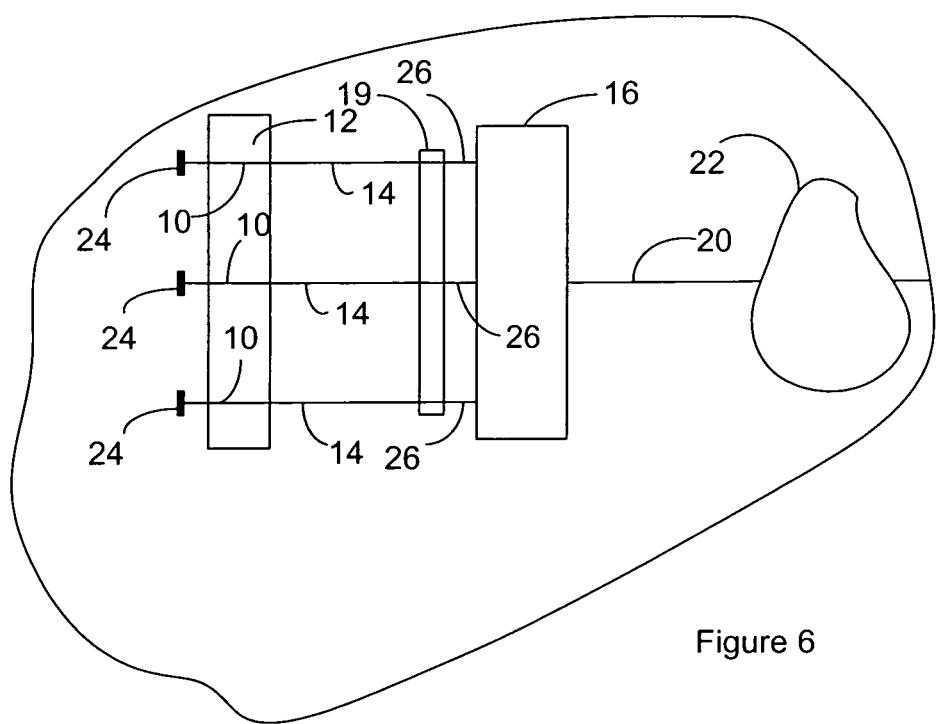

The one or more reflectors 24 need not contact the gain medium 12 as shown in FIG. 1 through FIG. 5B. For instance, FIG. 6 illustrates the device of FIG. 2 having intermediate waveguides 27 optically located between each of the gain waveguides 10 and one of the one or more reflectors 24. Each intermediate waveguide 27 can carry one of the light signal portions from the gain waveguide 10 to a reflector 24 which reflects the received light signal portion back into the intermediate waveguide 27 which carries the light signal to the gain waveguide 10. In some instances, the intermediate waveguides 27 are each the same length and are optically coupled in order to preserve the in phase nature of the light signal portions.

Figure 7:
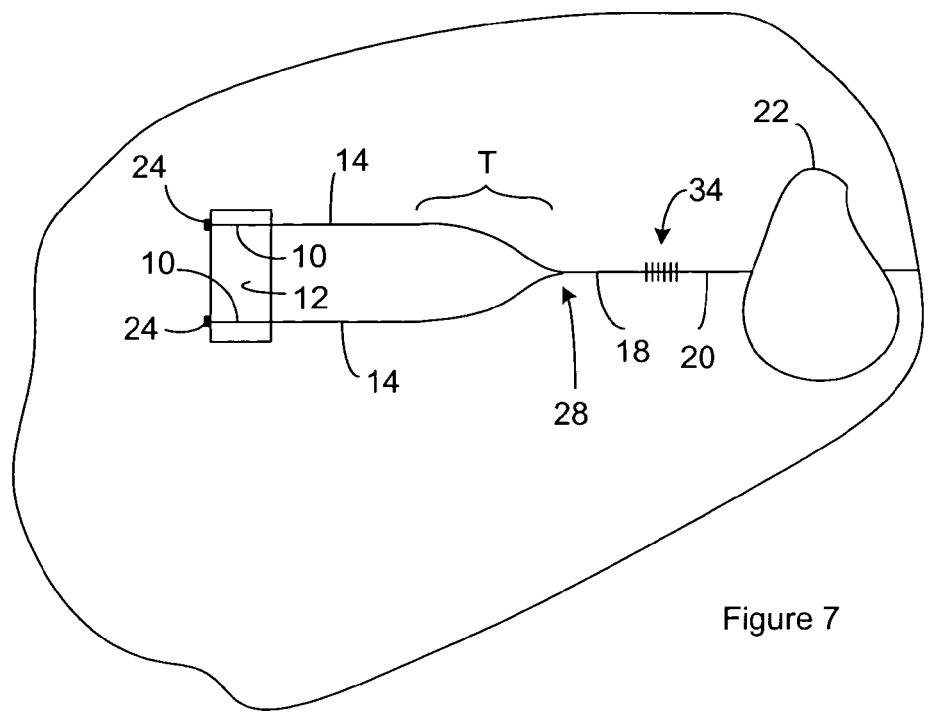
FIG. 7 illustrates an optical device constructed according to FIG. 1 with a single y-junction combiner serving as a combiner and a Bragg grating serving as a partial return device.
Figure 8:
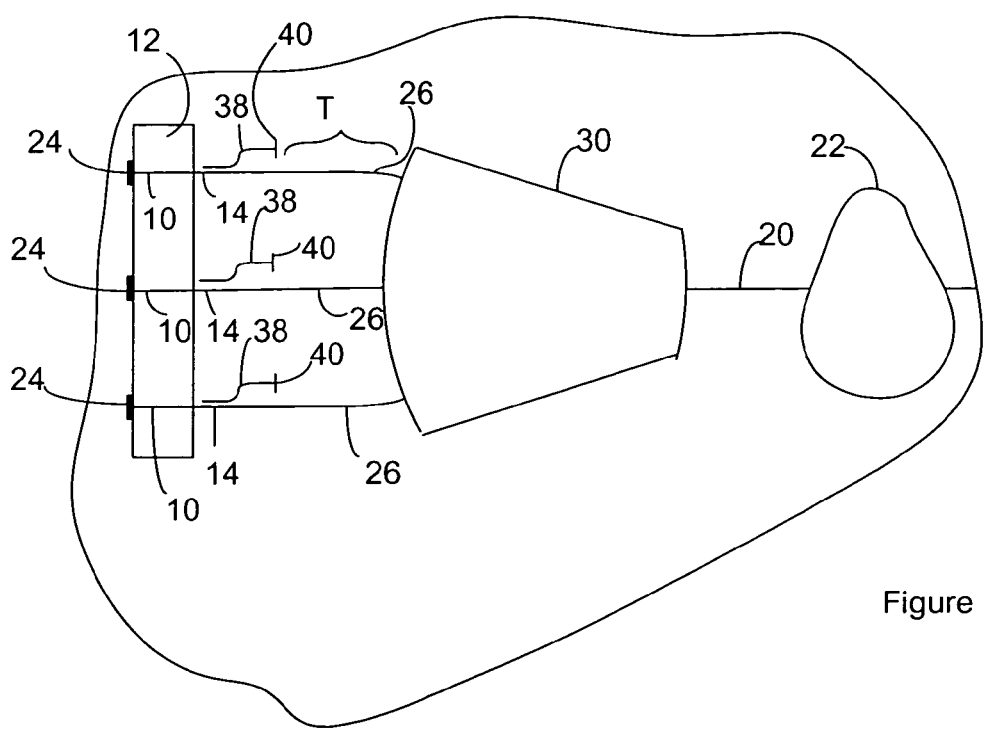
FIG. 8 illustrates an optical constructed according to FIG. 2 with a star coupler serving as a combiner and optical couplers serving as partial return devices.
Figure 9:
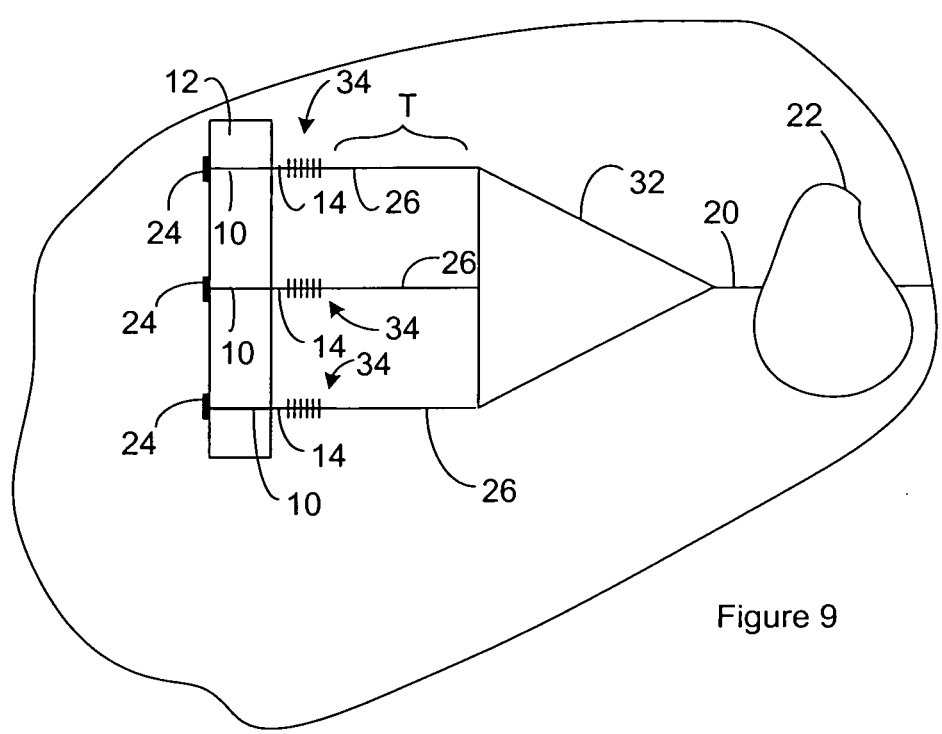
FIG. 9 illustrates an optical device constructed according to FIG. 2 with a lateral taper serving as the combiner and Bragg gratings serving as partial return devices.

Suitable wavelength independent combiners 16 include, but are not limited to, one or more y-junction combiners 16, star couplers, and tapered waveguides. FIG. 7 illustrates an optical device constructed according to FIG. 1 with a single y-junction combiner 28 serving as the combiner 16. FIG. 8 illustrates an optical constructed according to FIG. 2 with a star coupler 30 serving as the combiner 16. FIG. 9 illustrates an optical device constructed according to FIG. 2 with a laterally tapered waveguide 32 serving as the combiner 16. An input side of the laterally tapered waveguide 32 is common to each of the transition waveguides 26. When the device is constructed according to FIG. 1, the input side of the lateral taper is common to each of the cavity waveguides 14. A suitable construction of the lateral taper is an adiabatic taper. In some instances, multiplexers can serve as one or more of the combiners 16.

Although FIG. 7 is shown as combining output from two laser cavities, a device can cascade multiple y junctions to create a device that includes a number of laser cavities that is even and greater than two.

The transition waveguides 26 or cavity waveguides 14 can include vertical and/or horizontal tapers located before combiners 16 such as y-junction combiners 16, star couplers, and waveguide tapers. These tapers can reduce the level of optical loss caused by the combiner 16. A suitable location for the tapers is between the partial return devices 19 and combiners 16 as shown by the region labeled T in each of FIG. 8 and FIG. 9. Another suitable location for the tapers is between the gain medium 12 and the combiner 16 as shown by the region labeled T in FIG. 7. As will be disclosed below, a suitable construction for waveguides is a rib waveguide (also called a ridge waveguide). A rib waveguide can be laterally tapered by tapering the width of the rib (or ridge). A rib waveguide can be vertically tapered by tapering the height of the rib (or ridge). Suitable lateral tapers include, but are not limited to, adiabatic tapers. Suitable vertical tapers include, but are not limited to, adiabatic tapers.

Suitable partial return devices 19 include, but are not limited to, Bragg gratings, reflective surfaces, optical couplers where the coupled waveguide has a reflective facet, partially etched facets, and narrow etched gaps. FIG. 7 illustrates an optical device constructed according to FIG. 1 with a Bragg grating 34 serving as the partial return device 19. FIG. 8 illustrates an optical constructed according to FIG. 2 with optical couplers serving as the partial return device 19. FIG. 9 illustrates an optical device constructed according to FIG. 2 with Bragg gratings 34 serving as the partial return device 19.

The optical couplers of FIG. 8 includes a coupled waveguide 38 that is optically coupled with the cavity waveguide 14. The coupled waveguides 38 each ends at a reflector 40. When a light signal portion travels along a cavity waveguide 14 toward the combiner 16, a coupled portion of the light signal enters the coupled waveguide 38 and a transmitted portion of the light signal continues traveling on the cavity waveguide 14 toward the transition waveguide 26. The coupled waveguide 38 guides the coupled portion of the light signal to the reflector 40. The reflector 40 reflects the coupled portion of the light signal back along the coupled waveguide 38. The coupled portion of the light signal is then coupled into the cavity waveguide 14 and returns to the gain waveguide 10. The portion of the light signal coupled into the coupled waveguide 38 can be controlled by changing the separation between the coupled waveguide 38 and the cavity waveguide 14 and/or by changing the length of the cavity waveguide 14.

Suitable gain media for use in the multi-channel device include, but are not limited to, bulk semiconductor materials such as InP, InGaAsP, and GaAs. In some instances, the gain medium 12 can include one or more layers of material where each layer includes or consists of one or more bulk semiconductor materials. For instance, each layer can include or consist of InP, InGaAsP, GaAs and combinations thereof.

In some instances, the gain medium 12 used in the multi-channel device is a quantum dot gain element or a quantum dot gain medium 12. Quantum dots are semiconductors, which are crystals of group II-VI, III-V, or IV-VI materials. However, quantum dots have a smaller size than bulk semiconductors. For instance, quantum dots can be about 2-10 nanometers in diameter or about 10-50 atoms in diameter. As a result, quantum dots have been called nanocrystals. Unlike bulk semiconductors, small changes to the size of quantum dot can change the wavelength of the photons released from the quantum dots. For instance, the addition or subtraction of one or two atoms to the quantum dot can change the wavelength of the photons released from the quantum dots. In contrast, the addition or subtraction of one or two atoms to bulk semiconductor materials does not alter the wavelength of the photons released from the bulk semiconductor material.

Quantum dots also tend to show quantum confinement which is absent from bulk semiconductor materials. Quantum confinement occurs when the size of a semiconductor material approaches that material's Exiton Bohr radius. At this size, the electron energy levels in the semiconductor can no longer be treated as continuous and are instead discrete energy levels.

The relationship between the size of a quantum dot and the wavelength of the photons released by the quantum dot allows for particular wavelengths to be achieved by using quantum dots of a particular size in the gain medium 12. Additionally, quantum dots constructed from different semiconductor materials can generate different wavelengths even when they are about the same size. These features allow quantum dots to produce photons having wavelengths that are outside the range of wavelengths that can normally be achieved with bulk semiconductor materials.

The gain element for a quantum dot laser generally includes a gain medium 12 that includes quantum dots of different sizes and/or of different materials. For instance, one type of a quantum dot gain medium 12 is constructed of multiple layers with different layers of material where each layer has quantum dots of a different size and/or material than the neighboring layer(s).

Figure 10D:
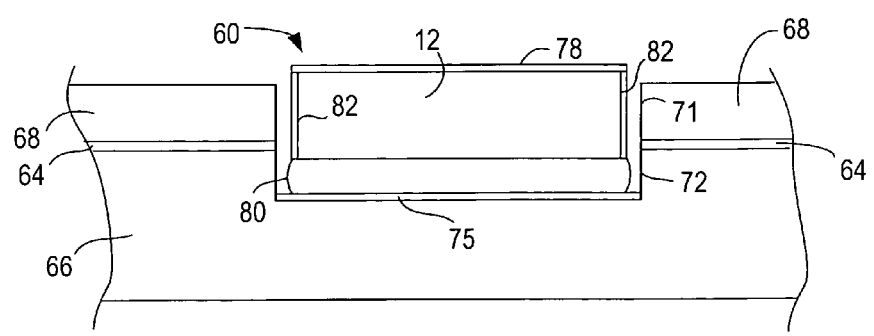

FIG. 10A through FIG. 10D illustrate a portion of a device having an interface between a cavity waveguide 14 and a gain medium chip that includes the gain medium 12. The device is constructed on a silicon-on-insulator wafer. FIG. 10A is a topview of the device. FIG. 10B is a cross section of the device shown in FIG. 10A taken along the line labeled B. The line labeled B extends through the cavity waveguide 14 disclosed in FIG. 10A. Accordingly, FIG. 10B is a cross section of the cavity waveguide 14. The silicon-on-insulator wafer includes a silicon slab 68 on a base that includes a silica layer 64 on a silicon substrate 66. The silicon of the silicon slab 68 serves as a light-transmitting medium in which waveguides can be defined. Trenches 70 in the silicon slab 68 define a ridge 72. The ridge 72 and the silica layer 64 define a light signal-carrying region where the light beam is constrained. For instance, the reduced index of refraction of the silica relative to the silicon prevents the light beam from entering the substrate from the silicon. The other waveguides on the device have a structure similar to the structure shown in FIG. 10B although they can have different dimensions. For instance, the cavity waveguides 14, common waveguide 18(s), any output waveguide 20(s), any transition waveguide 26(s), and any intermediate waveguide 27(s) can each have a structure as illustrated in FIG. 10B. Additionally, any star couplers, tapers such as are shown in FIG. 9, and y-junctions can have a cross section such as shown in FIG. 10B although the dimensions may be different. For instance, the width of the ridge 72 shown in FIG. 10B can be increased to form the star coupler of FIG. 8 or the taper of FIG. 9.

FIG. 10C is a cross section of the device shown in FIG. 10A taken along a line extending between the brackets labeled C in FIG. 10A. FIG. 10D is a cross section of the device shown in FIG. 10A taken along a line extending between the brackets labeled D in FIG. 10A. A first recess 71 extends into through the silicon slab 68 and the silica layer 64. A second recess 72 extends into the bottom of the first recess 71 such that the silicon substrate 66 forms shelves 73 in the bottom of the second recess 72. A first conducting layer 75 is positioned in the bottom of the second recess 72. A first conductor 76 on the silicon slab 68 is in electrical communication with the first conducting layer 75. A second conductor 77 on the silicon slab 68 is positioned adjacent to the first recess 71.

The gain medium chip 60 is positioned in the first recess 71 and rests on the shelves 73. The gain medium chip 60 includes a gain medium 12. Suitable materials for the gain medium 12 include, but are not limited to, an InP layer. A second conducting layer 78 is positioned on the gain medium 12. A third conductor 79 provides electrical communication between the second conducting layer 78 and the second conductor 77.

As is evident from FIG. 10C, the gain medium 12 has three ridges that extend into the second recess 72. The outer-most ridges have a passivation layer. The central ridge is in electrical communication with the first conducting layer 75. The electrical communication between the central ridge and the first conductor 76 can be achieved through a conducting medium 80 such as solder. Since the first conductor 76 is in electrical communication with the first conducting layer 75, the first conductor 76 is in electrical communication with the central ridge. The central ridge defines the location of the gain waveguide 10 in the gain medium 12.

A light signal portion can be generated from the gain medium 12 by applying an electrical signal to a gain medium so as to cause an electrical current to flow through the gain medium 12. Accordingly, the electrical signal applied to a laser cavity serves to pump the laser cavity. The electrical current can be generated by electronics (not shown) that apply a potential difference between the first conductor 76 and the second conductor 77. The potential difference can be provided by a power source 18 can be included on the device or can be separate from the device and the device can be configured to be electrically coupled with the power source 18.

The sides of the gain medium 12 through which a light signal portion enters and/or exits the gain medium 12 can have an anti-reflective coating 82. The beam of light exits and enters the gain medium 12 through the anti-reflective coating 82.

As is evident from FIG. 10A, the facet 81 for the cavity waveguides 14 can be angled at less than ninety degrees relative to the direction of propagation in the waveguide. Angling the facet 81 at less than ninety degrees can cause light signals reflected at the facet 81 to be reflected out of the waveguide and can accordingly reduce issues associated with back reflection.

The trenches 70 for the waveguides can be formed using traditional integrated circuit manufacturing masking and etching steps. The first recess 71 can be formed in a different mask and etch. Further, the second recess 72 can be formed in another mask and etch steps. The first conducting layer 75, the first conductor 76, and the second conductor 77 can be formed using traditional integrated circuit manufacturing techniques for forming metal traces on substrates.

Suitable gain medium chips 60 include, but are not limited to, InP chips. The electrical communication between the second conducting layer 78 and the second conductor 77 can be achieved using traditional techniques such as wire bonding. The electrical communication between the central ridge and the first conductor 76 can be achieved through traditional techniques such as solder bonding.

The portion of the device illustrated in FIG. 10A through FIG. 10D is suitable for use with an electrical power source, however, the illustrations in FIG. 10A through FIG. 10D can be adapted for use with a light source that serves as a power source. The light source can be included on the device or can be separate from the device.

FIG. 10A and FIG. 10D show an anti-reflective coating 82 on each facet of the gain medium 12. Such a structure is suitable for the use in device constructed according to FIG. 6 where a light signal portion passes through each of the facets. Alternately, one of the anti-reflective coatings 82 shown in FIG. 10A and FIG. 10D can be replaced with a reflective coating that acts as a reflector 24. Suitable reflecting coatings include a layer of metal such as a layer of aluminum, gold, or titanium.

Figure 11:
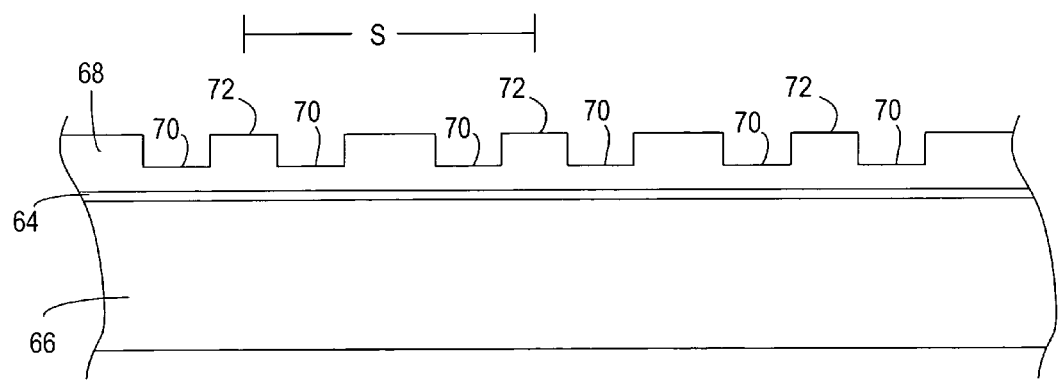
FIG. 11 illustrates a structure that permits optical coupling in waveguides constructed according to FIG. 10A through FIG. 10D.

FIG. 11 illustrates how optical coupling occurs in waveguides constructed according to FIG. 10A through FIG. 10D. The structure shown in FIG. 11 can apply to intermediate waveguides 27, and cavity waveguides 14. FIG. 11A is a cross section taken across cavity waveguides 14 that are arranged adjacent to one another on the device. For instance, when the device of FIG. 2 is constructed according to FIG. 10A through FIG. 10D, FIG. 11 would represent a cross section taken along the line labeled K in FIG. 2. In FIG. 11, the silicon slab 68 is continuous between adjacent waveguides. As a result, the silicon allows light signal portions in adjacent waveguides to interact with one another.

Increasing the separation between adjacent waveguides can reduce or eliminate the optical coupling. The separation between adjacent waveguides is labeled S in FIG. 11 and is measured relative to the center of the waveguides. A suitable separation, S, for optical coupling is separations greater than 0.5 um, 1 um, and 2 um and/or less than 3 um, 4 um, and 5 um.

Figure 12:
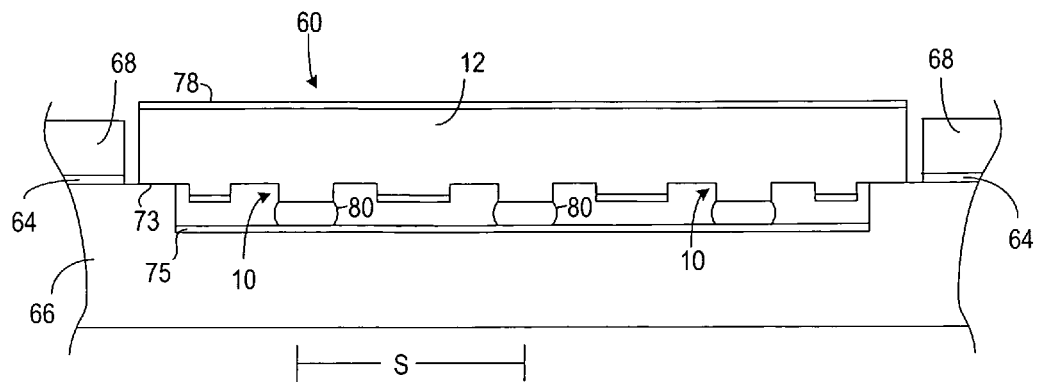
FIG. 12 illustrates a structure that permits optical coupling in waveguides defined in a gain medium and constructed according to FIG. 10A through FIG. 10D.

FIG. 12 illustrates how optical coupling occurs in gain waveguides 10 constructed according to FIG. 10A through FIG. 10D. FIG. 12 is a cross section taken across gain waveguides 10 that are arranged adjacent to one another on the device. For instance, when the device of FIG. 2 and/or FIG. 3 is constructed according to FIG. 10A through FIG. 10D, FIG. 12 would represent a cross section taken along the line labeled L in FIG. 2 and/or FIG. 3. In FIG. 12, the gain medium 12 is continuous between adjacent gain waveguides 10. As a result, the gain medium 12 allows light signal portions in adjacent gain waveguides 10 to interact with one another.

Increasing the separation between adjacent gain waveguides 10 can reduce or eliminate the optical coupling. The separation between adjacent gain waveguides 10 is labeled S in FIG. 12 and is measured relative to the center of the gain waveguides 10. A suitable separation, S, for optical coupling is separations greater than 0.5 um, 1 um, and 2 um and/or less than 3 um, 4 um, and 5 um.

Figure 13:
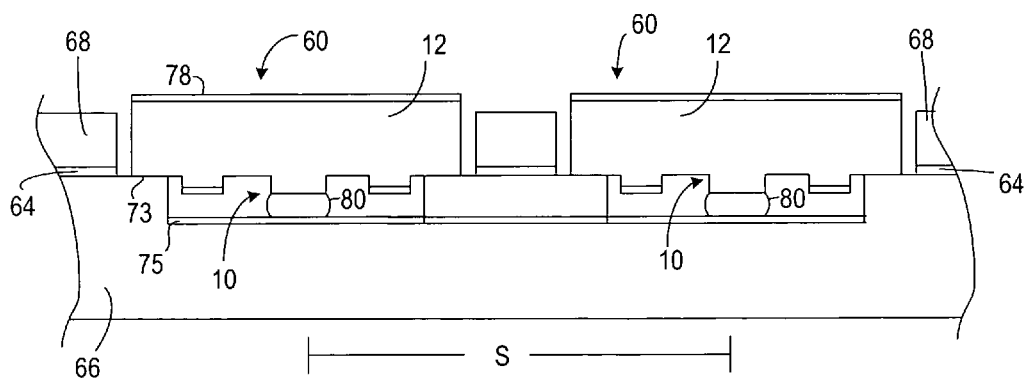
FIG. 13 illustrates a structure that permits optical coupling in gain waveguides constructed according to FIG. 10A through FIG. 10D when a single gain medium is not shared by multiple laser cavities.

FIG. 13 illustrates how optical coupling occurs in gain waveguides 10 constructed according to FIG. 10A through FIG. 10D when a single gain medium 12 is not shared by multiple laser cavities. FIG. 13 is a cross section taken across gain waveguides 10 that are arranged adjacent to one another on the device. For instance, when the device of FIG. 5A or FIG. 5B is constructed according to FIG. 10A through FIG. 10D, FIG. 13 would represent a portion of the cross section taken along the line labeled A in FIG. 5A or FIG. 5B. FIG. 13 shows a gap between adjacent gain media 12 and/or between a gain medium and adjacent light-transmitting medium. Since optical coupling is more efficient without this gap, the device can be constructed so these gaps are not present. However, high quality optical coupling can still be achieved when these gaps are on the order of 1-2 μm. Larger gaps may be possible in some instances. As a result, the gain medium 12 and silicon slab 68 allow light signal portions in adjacent gain waveguides 10 to interact with one another.

Increasing the separation between adjacent gain waveguides 10 can reduce or eliminate the optical coupling. The separation between adjacent gain waveguides 10 is labeled S in FIG. 13 and is measured relative to the center of the gain waveguides 10. A suitable separation, S, for optical coupling is separations greater than 0.5 um, 1 um, and 2 um and/or less than 3 um, 4 um, and 5 um.

In the structure of FIG. 12, each of the laser cavities shares a first conducting layer 75 and second conducting layer 78. As a result, the electronics apply the same electrical signal to each laser cavity in order to pump each of the laser cavities. The electronics can modulate the output from each of the laser cavities by applying a modulated electrical signal to the first conducting layer 75 and second conducting layer 78. Alternately, the electronics can cause the laser cavities to produce an unmodulated light signal. For instance, the electronics can apply a constant voltage electrical signal across the laser cavities.

The optical device can be configured such that the electronics can apply different electrical signals to different portion of the laser cavities. For instance, a portion of the laser cavities can have a different first conducting layer 75 and/or different second conducting layer 78 than the other laser cavities. As an example, the structure of FIG. 13 shows each gain medium chip 60 with a different first conducting layer 75 and a different second conducting layer 78. As a result, the electronics can apply a different electrical signal to each of the different laser cavities and/or can apply a different electrical signal to a portion of the laser cavities than is applied to one or more other laser cavities. Accordingly, different laser cavities can be pumped by different electrical signals.

When the combiner 16 is positioned in the laser cavities, the ability to apply a different electrical signal to different portions of the laser cavities can provide a more efficient method for modulating the laser output. For instance, the electronics can apply a first electrical signal to a first portion of the laser cavities and a second electrical signal to the remaining laser cavities (called the second portion of the laser cavities below). The first electrical signal can be selected such that the laser cavities lase when the voltage of the second signal is high; but stop lasing when the voltage of the second signal drops far enough. The laser cavities stop lasing because dropping the amount of power applied to one or more of the laser cavities causes the amount of light that returns to each gain waveguide to decrease. The amount of returned light decreases because the light that returns from the partial return device 19 is divided up by the combiner 16 and the combiner 16 does take into account the gain medium from which a photon originated when dividing up the light. For instance, the combiner 16 does not return each photon to the gain medium from which it originated. Instead, the combiner divides the light among the different gain media in about the same proportions even when one of the gain media is no longer acting as a source of light. Accordingly, decreasing the amount of light that is output from the gain medium in one of the laser cavities causes less light to be returned to other gain media. The amount of light output from one of the gain medium can be decreased until the amount of light returned to other gain media becomes so low that the laser cavity(ies) that include the other gain media stop lasing even though the same electrical signal continues to be applied to them. The below modulation scheme takes advantage of this feature.

The second signal can be a modulated electrical signal. A modulated electrical signal has data encoded onto it or causes the combined output of the laser cavities to have data encoded onto it. In some instances, the second electrical signal is modulated between a maximum value and a minimum value with time. For instance, the second electrical signal can be a modulated RF signal (frequency in a range of 3 kHz to 300 GHz) for communications applications (100 MHz to 300 GHz).

The first electrical signal has a voltage between a first threshold and a second threshold. The first threshold is the lowest voltage at which the laser cavities will lase when the second electrical signal is at its maximum voltage. For instance, suppose the second electrical signal has a voltage that varies between 0 V and 1 V. The first threshold is the lowest voltage to which the first electrical signal can be dropped before the laser cavities stop lasing when the second electrical signal is at 1V. Accordingly, the laser cavities will lase when the first electrical signal has a voltage above the first threshold and the second electrical signal is at its maximum value.

The second threshold is the highest voltage that the first electrical signal can have without causing lasing of the laser cavities when the second electrical signal is at its minimum voltage. Again, suppose the second electrical signal has a voltage that varies between 0 V and 1 V. The second threshold is the highest voltage to which the first electrical signal can be increased before the laser cavities begin lasing when the second electrical signal is at 0V. Accordingly, the laser cavities will not lase when the first electrical signal has a voltage below the second threshold and the second electrical signal is at its minimum value.

The above definitions show that when the first electrical signal has a voltage between the first threshold and the second threshold, the laser cavities do not lase when the second electrical signal is at is minimum value but do lase when the second electrical signal is at its maximum value. Since lasing of the laser cavities causes the laser output to be more intense than when the laser cavities fail to lase, the laser output be modulated by varying the second electrical signal between the maximum and minimum values. Since this modulation can be achieved when the first electrical signal is between the first threshold and the second threshold, the voltage of the first electrical signal can vary as long as it remains between the first threshold and the second threshold. Accordingly, the first electrical signal can be a constant polarity signal with a voltage between the first threshold and the second threshold. The first electrical signal can have data encoded onto it or can exclude data. In one example, the first electrical signal is a constant voltage signal or a direct current (DC) signal.

The ability to modulate the combined output of the laser cavities by applying a DC signal to a portion of the laser cavities while applying a modulated electrical signal to another portion of the laser cavities increase the efficiency of the modulation scheme by reducing the current of the electrical signal that must be modulated in order to produce a modulated laser output. For instance, a modulated laser output can be achieved by applying a modulated electrical signal to only one laser cavity while applying a DC signal to the remaining laser cavities. As a result, the amount of electrical current that must be modulated is greatly reduced when compared to the amount of electrical current that would be modulated in the structure of FIG. 12. Since modulation of the electrical signals such as RF signals is often requires undesirably large levels of power, this reduced power requirement is desirable. Further, the reduced power require can reduce the size and costs of the electronics driving circuitry.

Although the above modulation scheme is disclosed in the context of FIG. 13, the modulation scheme can be employed with other structures. For instance, a first portion of the laser cavities can share a first conducting layer and a second conducting layer and another portion of the laser cavities can share a different first conducting layer and a different second conducting layer. Accordingly, the first electrical signal can be concurrently applied to the first portion of the laser cavities and the second electrical signal can be concurrently applied to the second portion of the laser cavities. In another example, the gain medium 12 is arranged as shown in FIG. 12 but a first portion of the gain waveguide(s) 10 have a different first conducting layer than a second portion of the gain waveguides and/or the first portion of the gain waveguide(s) 10 have a different second conducting layer than a second portion of the gain waveguides. In this arrangement, it is possible that the first electrical signal applied to the first portion of the gain waveguides and the second electrical signal applied to the second portion of the gain waveguides will interfere as a result of the continuous gain medium between different gain waveguides and the close proximity of different gain waveguides.

When a waveguide is a rib or ridge waveguide constructed according to FIG. 10A through FIG. 13, a partial return device 19 such as a Bragg grating 34 can be formed in the waveguide by etching grooves across the top of the ridge or rib. Accordingly, a partial return device 19 can be defined in a gain waveguide 10, cavity waveguide 14, or common waveguide 18 by forming grooves across the top of the ridge. The number, spacing, and depth of the grooves can be selected to achieve the desired wavelength that is reflected as well as the proportion of the light signal (portion) that is reflected or transmitted by the partial return device 19.

Reflectors such as the one or more reflectors 24 and/or the reflector 40 can be formed by placement of a reflective material on a facet of the waveguide. Example reflective materials include reflective metals. The reflective metals can be formed on the device using traditional integrated circuit manufacturing techniques.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:
1. An optical device, comprising:
multiple laser cavities that each reflects a different portion of a light signal back and forth between reflective components;
each laser cavity guiding one of the light signal portions through a gain waveguide and also through a cavity waveguide,
the gain waveguides each including a gain medium;
the cavity waveguides from different laser cavities being optically coupled to one another; and
a combiner receiving the light signal portion from each one of the laser cavities and combining the received light signal portions into the light signal.
2. The device of claim 1, wherein each of the light signal portions has the same wavelength distribution.
3. The device of claim 1, wherein the gain waveguides are each defined in the laser gain medium.
4. The device of claim 1, wherein the gain waveguides are optically coupled.
5. The device of claim 1, wherein the cavity waveguides each excludes the gain medium.
6. The device of claim 5, wherein the cavity waveguides each exchange one of the light signal portions with one of the gain waveguides.
7. The device of claim 6, wherein at least a portion of the reflective components are partial return devices that each receives one of the light signal portions,
each of the partial return devices being positioned along a different one of the cavity waveguides so as to receive the light signal portion traveling along the cavity waveguide,
each of the partial return devices returning a first portion of the received light signal portion to the cavity waveguide from which the partial return device received the received light signal portion, each of the partial return devices causing an output portion of the received light signal portion to enter a different one of multiple transition waveguides included on the device, and the output portion of one of the received light signals being a different portion of the received light signal portion than the first portion of the received light signal portion.

8. The device of claim 7, wherein each of the partial return devices is configured such that each of the first portions has the same wavelength distribution.

9. The device of claim 8, wherein each of the transitions waveguides guides one of the light signal portions to the combiner.

10. The device of claim 9, wherein the transition waveguides and the combiner are designed such that an optical path that each light signal portion travels from the partial return device to a location where they are combined into the light signal by the combiner have lengths that different from one another by $n\lambda$ where $\lambda$ is the wavelength of the light signal and n is 0 or an integer.

11. The device of claim 1, wherein at least a portion of the reflective components are partial return devices that each receives one of the light signal portions, each of the partial return devices being defined in the gain medium.

12. The device of claim 1, wherein the cavity waveguides guide each of the light signal portions from one of the gain waveguides to the combiner.

13. The device of claim 1, wherein
a common waveguide receives the light signal from the combiner,
a partial return device receives the light signal from the common waveguide,
the partial return device returning a first portion of the received light signal to the common waveguide, and
the partial return device causing an output portion of the received light signal to enter an output waveguide, and
the output portion of the light signal being different than the first portion of the light signal.

14. The device of claim 13, wherein the common waveguide guides the first portion of the received light signal to the combiner.

15. The device of claim 14, wherein the combiner acts a wavelength independent splitter that splits the received light signals into the light signal portions such that each of the light signal portions is received on a different one of the cavity waveguides.

16. The device of claim 1, further comprising:
electronics that apply a first electrical signal to a first portion of the laser cavities so as to pump the first portion of the laser cavities,
the electronics applying a second electrical signal to a second portion of the laser cavities so as to pump the second portion of the laser cavities the first portion of the laser cavities being different from the second portion of the laser cavities,
the first electrical signal being applied to the first portion of the laser cavities without being applied to the second portion of the laser cavities and the second electrical signal being applied to the second portion of the laser cavities without being applied to the first portion, and
the first electrical signal being different from the second electrical signal.

17. The device of claim 16, wherein the second electrical signal varies between a minimum voltage and a maximum voltage and the first electrical signal has a voltage between a first threshold and a second threshold,
the first threshold being a lowest voltage at which the laser cavities lase when the second electrical signal is at its maximum voltage, and
the second threshold being the highest voltage that the first electrical signal can have without causing lasing of the laser cavities when the second electrical signal is at its minimum voltage.

18. The device of claim 17, wherein the first electrical signal is a direct current (DC) signal and the second electrical signal is a radio frequency (RF) signal.

19. The device of claim 16, wherein each of the laser cavities is included in the first portion or in the second portion.

20. The device of claim 19, wherein a medium through which the gain waveguides guide the light signal portions being different from a medium through which the transition waveguides guide the light signal portions.

* * * * *